United States Patent [19]

Gillotti et al.

[11] Patent Number: 4,771,930

[45] Date of Patent: Sep. 20, 1988

[54] APPARATUS FOR SUPPLYING UNIFORM TAIL LENGTHS

[75] Inventors: Gary S. Gillotti, Telford; David A. Leonhardt, Norristown, both of Pa.

[73] Assignee: Kulicke and Soffa Industries Inc., Willow Grove, Pa.

[21] Appl. No.: 879,939

[22] Filed: Jun. 30, 1986

[51] Int. Cl.$^4$ .............................................. B23K 37/00
[52] U.S. Cl. ..................................... 228/102; 228/4.5; 228/179; 228/10; 228/1.1
[58] Field of Search ................... 228/102, 1.1, 4.5, 10, 228/179, 104

[56] References Cited

U.S. PATENT DOCUMENTS

| | | | |
|---|---|---|---|
| 3,961,417 | 6/1976 | George | 228/4.5 |
| 4,268,739 | 5/1981 | Evans | 228/4.5 |
| 4,341,574 | 7/1982 | Landes | 228/1.1 |
| 4,359,623 | 11/1982 | Fanning | 228/4.5 |
| 4,438,880 | 3/1984 | Smith et al. | 228/1.1 |
| 4,475,681 | 10/1984 | Ingle | 228/179 |
| 4,485,957 | 12/1984 | Sugimoto et al. | 228/4.5 |
| 4,558,596 | 12/1985 | McBrealty | 228/4.5 |
| 4,571,688 | 2/1986 | Kashihara et al. | 228/1.1 |
| 4,586,642 | 5/1986 | Drubelbis et al. | 228/9 |

*Primary Examiner*—Nicholas P. Godici
*Assistant Examiner*—Karen Skillman
*Attorney, Agent, or Firm*—John B. Sowell

[57] ABSTRACT

A novel and improved monitoring and detecting circuit is provided for an automatic wedge wire bonder. The detecting circuit is initiated at the second wire bond while the bonding tool is pressing the bonding wire on the pad or electrode. If the fine wire is missing under the working face of the bonding tool, the sensing circuit initiates a signal which is detected by control means so as to initiate an interrupt signal stopping the operation of the wire bonder. Sensing of the presence or absence of a wire under the bonding wedge at a bond may take place at a first or a second wire bond. At the second wire bond, the novel sensing and detecting circuit is actuated to determine the amount of longation that takes place in the bonding wire between the bonding wedge and the wire clamps so as to correct the movement of the wire clamps when supplying a tail under the working face of the bonding tool and to ensure that a uniform tail length is supplied unaffected by the elongation of the bonding wire.

16 Claims, 3 Drawing Sheets

APPARATUS FOR SUPPLYING UNIFORM TAIL LENGTHS

BACKGROUND OF THE INVENTION

1. Field of the Invention

The present invention relates to an improved wire feed apparatus and more particularly to a novel electrical circuit for sensing the presence of a second bond and for monitoring the continuity of bonding wire between the bonding tool and the wire clamps of an automatic wire bonder.

2. Description of the Prior Art

Automatic wire bonders are classified in Class 228, subclasses is 1 to 4.5. Wire feed mechanisms for fine bonding wires employed on such wire bonders are classified in International Class H 01 L, subclasses 21/60 and 23/48. The present invention is adapted to be incorporated into an existing Model 1471 automatic wedge wire bonder which is commercially available from Kulicke and Soffa Industries, Inc. in Willow Grove, Pa. 19090.

Automatic wire bonders are adapted to interconnect fine wire between the electrodes or terminals of semiconductor chips with the lead out pads on carriers or substrates without the necessity of an operator observing or controlling the bonding machine. Needless to say, numerous conditions can occur which can cause a malfunctions or improper bonds. If such malfunctions are permitted to proceed without stopping the automatic wire bonder, a very large number of semiconductor chips may be harmed beyond repair. It has been recognized heretofore that protective means must be incorporated onto automatic wire bonders to prevent destruction of valuable semiconductor chips.

Heretofore, circuits have been designed for detecting missing wires in wire feed systems of automatic wire bonders. A typical example of such a circuit is shown in U.S. Pat. No. 4,485,957. This device detects the continuity between the wire on the wire spool and the bonding wire at the wire clamps. If the bonding wire is in the wire clamps during the clamping operation, the circuits sense the space caused by the presence of the wire, however, such circuits do not detect the presence or the absence of the bonding wire under the bonding tool.

U.S. Pat. Nos. 4,558,596 and 4,586,642, assigned to Kulicke and Soffa Industries, Inc., teach circuits for monitoring the presence of the bond and the condition of the bond. Such circuits employ statistical data to enhance the result of the bond monitors. However, such circuits require an accumulation of statistical data as well as experience with the type and size of fine bonding wire being employed.

The prior art detecting circuits detect missing bonds as well as bad bonds and will stop the automatic wire bonder. Some of the bonds that are deemed to be acceptable are detected as being imperfect or improper bonds and the automatic wire bonder is stopped until a maintenance operator can examine the reason for the stoppage and restart the automatic wire bonder. The present invention is not concerned with detecting the quality of the bond being made but is concerned with detecting if a bond has been made and whether wire is being consumed during the bonding operation which is indicative of proper operation of the automatic wire bonder. Thus, the improved sensing or monitoring circuit is capable of producing greater output without producing any scrap. The present sensing and monitoring circuit does not stop the wire bonder unless wire bonds are not being made and/or no fine wire is being consumed while making the wire bond interconnections.

It is desirable to provide an improved monitor and sensing circuit for detecting the continuous presence of bonding wire at the bonding tool of an automatic wire bonder. In the absence of the simple foregoing conditions, the automatic wire bonder will stop all wire bonding operations without proceeding to destroy the semiconductor device being wire bonded.

SUMMARY OF THE INVENTION

It is the principal object of the present invention to provide an improved circuit for detecting the absence of a missing wire or the second wire bond.

It is another principal object of the present invention to provide an apparatus for supplying uniform tail lengths of bonding wire under the bonding wedge of an automatic wire bonder in preparation for a first bond.

It is a general object of the present invention to provide a simple and reliable electrical circuit for sensing the absence or presence of a fine wire under the working face of a bonding tool at the second wire bond.

It is another general object of the present invention to provide means for monitoring and measuring the elongation of the bonding wire between the bonding wedge and the wire clamps at the time of breaking the wire at the second wire bond.

It is another general object of the present invention to provide means for calculating the desired length of a uniform length tail which includes the stretch or elongation of the fine bonding wire which occurs at breakage at the second bond.

It is another general object of the present invention to provide a circuit for monitoring the movement of the wire spool feed motor during bonding operations to determine that fine wire is being consumed during the bonding operation.

It it yet another object of the present invention to provide a reliable monitoring and sensing circuit for stopping all wire bonding operations the instant an improper interconnection or second wire bond is detected in order to salvage and rework expensive semiconductor devices.

In accordance with these and other objects of the present invention, to be explained in detail hereinafter, there is provided apparatus for supplying uniform tail lengths and for monitoring the presence or absence of a bonding wire under a bonding tool. The bonding tool is held down on the fine bonding wire at second bond while the wire clamps are moved in a direction to break the fine bonding wire at the bonding tool. The displacement of the wire clamps is measured during the elongation of the bonding wire until the bonding wire breaks to determine the elongation of the bonding wire between the bonding tool and the wire clamps. The amount of elongation is substracted from a predetermined desirable tail length to determine the distance to move the wire clamps in a direction to supply a uniform tail length of fine bonding wire under the bonding tool.

DESCRIPTION OF THE PREFERRED EMBODIMENT

Figure 1:
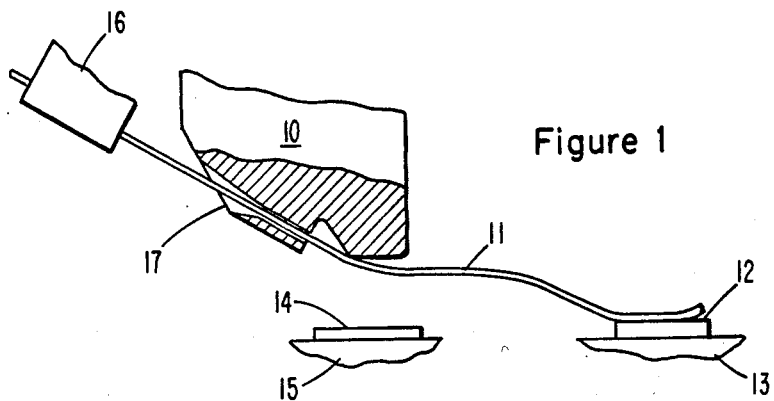
FIGS. 1 to 5 are enlarged elevations in partial section of a wedge bonding tool at different positions during the bonding operation.

Refer now to FIGS. 1 to 5 showing an enlarged elevation and partial section of a bonding wedge 10 at different positions during the first and second bond operation. In FIG. 1, the fine wire 11 has been bonded to a pad or electrode 12 on a semiconductor device 13 and the bonding tool has been raised and moved to the left so as to be positioned over the lead out pad or terminal 14 on the substrate or carrier 15. As is well known, the wire clamps 16 must be open in order for the fine wire 11 to be paid out through the wire guide 17 to form the interconnection between the pad 12 and the pad 14. In the preferred embodiment of the present invention, the wire is being supplied from a slack loop not shown.

Figure 2:
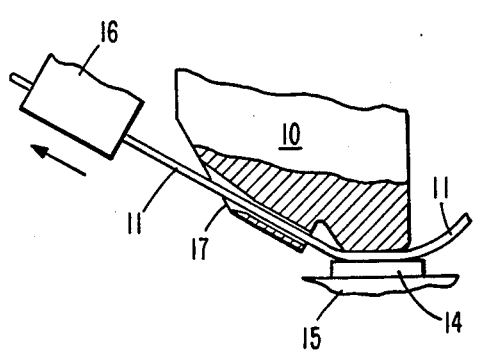

At the FIG. 2 position, the bonding tool 10 engages the fine wire 11 against the pad 14 and by application of ultrasonic energy force and heat causes the fine wire 11 to be bonded to the pad 14 at the second bond. At this point in the bonding operation, the wire clamps 16 are closed and are moved or articulated to the left as shown by the arrow, causing the wire 11 between the working face of the bonding wedge 10 and with wire clamps 16 to be elongated to the point shown in FIG. 3 where the wire breaks at the reduced and weakened heel portion 18 of the bonding tool 10. As will be explained in greater detail hereinafter, the movement of the wire clamps 16 are measured and calculated so as to determine the stretch or elongation which occurs in the bonding wire 11.

Figure 4:
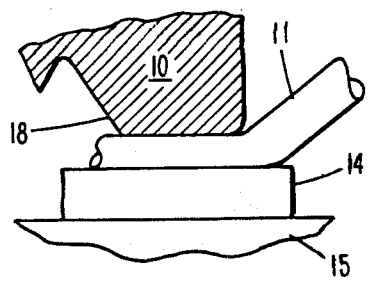

FIG. 4 is a greatly enlarged section of the bonding tool 10 showing the heel 18 of the wedge 10 which weakens the portion of the wire 11 at the bond to the point where it will break opposite the heel 18 and insuring that breakage occurs at the same place every time.

Figure 3:
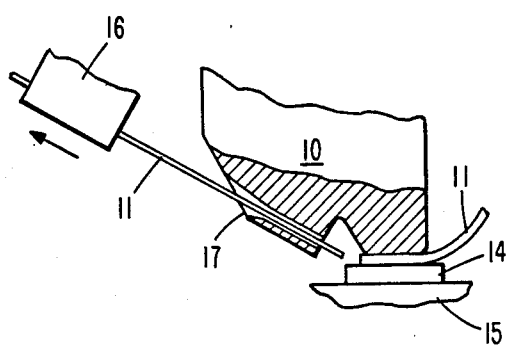
Figure 5:
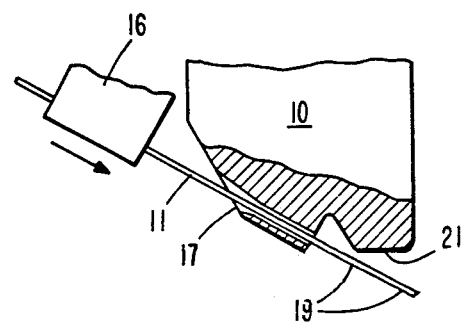

FIG. 5 shows the wire clamps 16 being moved to the right while still clamped on the fine wire 11 so as to force the wire 11 into the wire guide 17 and produce a predetermined and uniform length of tail 19 under the working face 21 of the bonding tool 10. As will be explained in greater detail hereinafter, the amount of elongation in the wire being held by the wire clamps 16 in FIG. 3 is calculated accurately. Since the wire 11, held by the wire clamps has been elongated, it is not necessary to move the wire clamp 16, shown in FIG. 5 the full theoretical distance for supplying the uniform tail length 19. Stated differently, the amount of movement of the wire clamps in FIG. 5 can be accurately determined to produce the desired tail 19 if no elongation occurs. However, since elongation occurs, the amount of movement to the right of the wire clamp 16 is less than the predetermined value without elongation. When the uniform and proper tail length 19 is supplied under the working face 21 of the bonding wedge 10, the conditions for a proper first bond are substantially enhanced.

Figure 6:
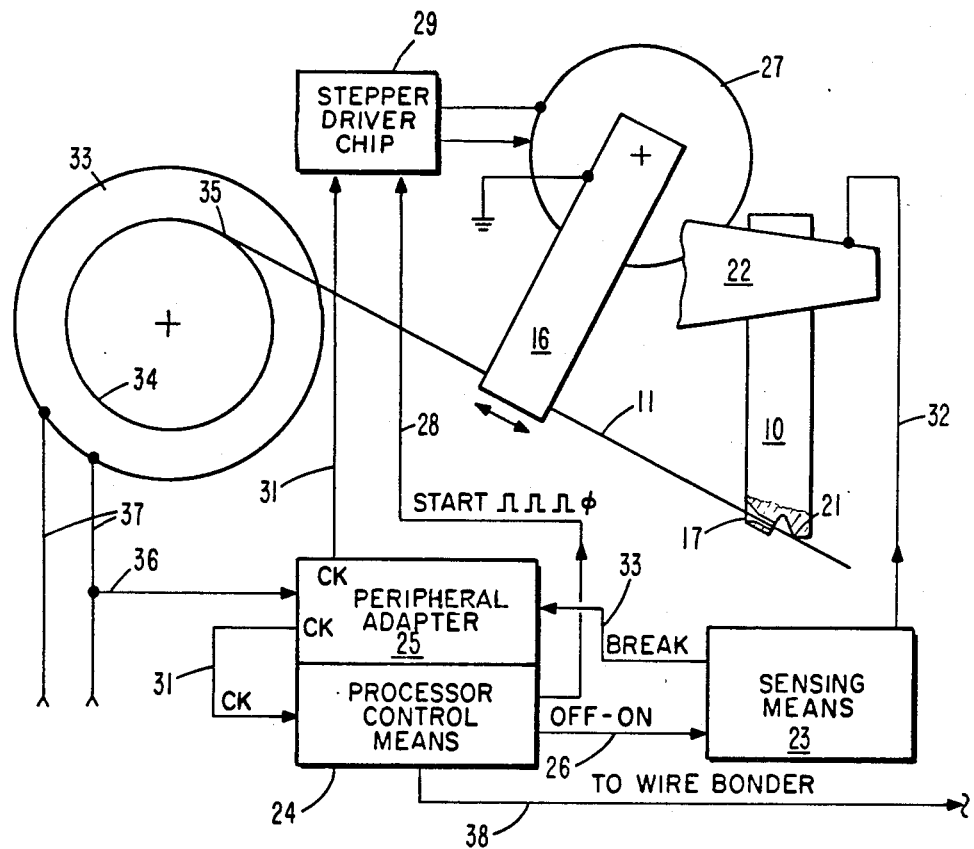
FIG. 6 is a schematic block diagram of the preferred embodiment apparatus of the present invention.

Refer now to FIG. 6 showing a schematic block diagram of the preferred embodiment apparatus for monitoring the continuity of the wire between the bonding wedge 10 and the wire clamps 16. Bonding wedge 10 is shown mounted in an ultrasonic transducer 22. The transducer is electrically connected to sensing means 23 which senses the condition of the bonding wire 11 at the second bond and during the tearing or breaking operation of the bonding wire 11 from the working face 21 of the bonding tool 10. The sensing means 23 are turned OFF and ON by processor control means 24 as will be explained hereinafter. The output of the sensing means 23 is connected through a peripheral adaptor 25 which is at the interface input of the processor control means 24. Such peripheral adaptors are standard and do not require additional explanation ion here. the processor control means in the preferred embodiment comprise a Motorola 6809, 8 bit micro processor. Equivalent micro processors are equally applicable to the present invention. The sensing means 23 are turned ON via line 26 at the second bond to initiate the sensing operation as well as to initiate the movement of the wire clamp or stepping motor 27 via line 28 which is connected to the stepping motor 27 through a motor driver chip 29. The peripheral adaptor 25 has an on-board timer which is controlled by processor control 24. When a stepper motor is employed, the timer or clock is connected to processor control means 24 and to motor driver chip 29 via connection lines 31.

In the preferred mode of operation, processor control 24 turns ON sensing means 23 via line 26. A voltage is applied via line 32 to the transducer 22 which is electrically isolated from the wire bonding machine so that the voltage applied via line 32 also appears at the working face 21 of the bonding wedge 10. When the bonding wedge 10 is pressed and held against the fine wire 11 at the second bond, the reference voltage appears on the bonding wire 11. The continuous electrical path through the bonding wire 11 continues through the wire clamps 16 which are connected to an electrical ground. As will be explained hereinafter, when the bonding wire 11 breaks at the heel 18 of the bonding tool 10, the continuous electrical path for the reference voltage on line 32 is interrupted. This interruption is sensed at the time the bonding wire breaks. The processor control means 24 starts a timer or counter the clock signals appearing on line 31 at the time the motor 27 is initiated to articulate or move the wire clamp 16 to the left to tear the bonding wire 11. The break signal is sensed on the sensing means output line 33 and is applied through the peripheral adaptor 25 to the processor control 24 stopping the count of the clock signals or the timer at the time of breakage of the fine wire 11 as previously explained with regards to FIGS. 3 and 4. The number of clock pulses which are counted or the time measured during the movement of wire clamp 16 before breaking the wire is indicative of the elongation of the wire 11 between the bonding wedge 10 and the wire clamp 16. A predetermined tail length is stored in the form of a train of pulses in processor control means 24. The amount of elongation is substracted from this predetermined uniform tail length and the pulse train is applied via line 28 along with a phase signal to the stepper motor 27. This signal is capable of articulating or moving the wire clamp 16 a predetermined distance minus the elongation measured in the fine wire 11 during the breaking operation. Thus, when the wire clamps are again moved to the right, a uniform tail length of wire 11 is forced through wire guide 17 to provide a desired and uniform length of tail under the working face 21 of the bonding wedge 10 as shown in FIG. 5.

In addition to measuring the amount of elongation which occurs during the breaking or tearing operation at second bond, the present invention also monitors the movement of the wire spool drive motor 33 which drives the wire spool 34 to provide a slack loop 35. Apparatus for automatically supplying the slack loop is shown in our co-pending application Ser. No. 862,988 filed May 14, 1986 for an Automatic Wire Feed System. A sense line 36 is connected to the power lines 37 and to the processor control 24 via the peripheral adaptor 25. When electrical energy is supplied via the power lines 37 to the stepper motor 33, movement of the stepper motor is sensed via the presence of an electrical signal on line 36. In the preferred embodiment of the present invention, the processor control means are programmed to terminate all bonding operations if the wire spool stepper motor 33 does not supply slack wire to the bonding tool 10 during one or more complete bonding operations between bonding pads. If the wires interconnecting the bonding pads are very short, the slack loop 35 is capable of supplying enough wire for more than one interconnection before the stepper motor 33 is energized to supply additional slack wire. When the processor control 24 senses that slack wire is not being supplied during the predetermined number of bonding operations or that the bonding wire 11 is not under the working face of the bonding tool 10 at the second bond, an interrupt signal is provided on line 38 to the wire bonder (not shown) which ceases the operation of the automatic wire bonder to prevent harm to the semiconductor device being bonded. It is to be understood that the present preferred embodiment apparatus can cease wire bonding operation upon sensing the absence, of any second bond or sensing the absence of the fine wire in the wire clamps. Further, the preferred embodiment apparatus shown in FIG. 6 is capable of ceasing the automatic wire bonding operation when the wire spool stepper motor or drive motor 33 is not operated when it should be supplying wire during one or more bonding operations.

Figure 7:
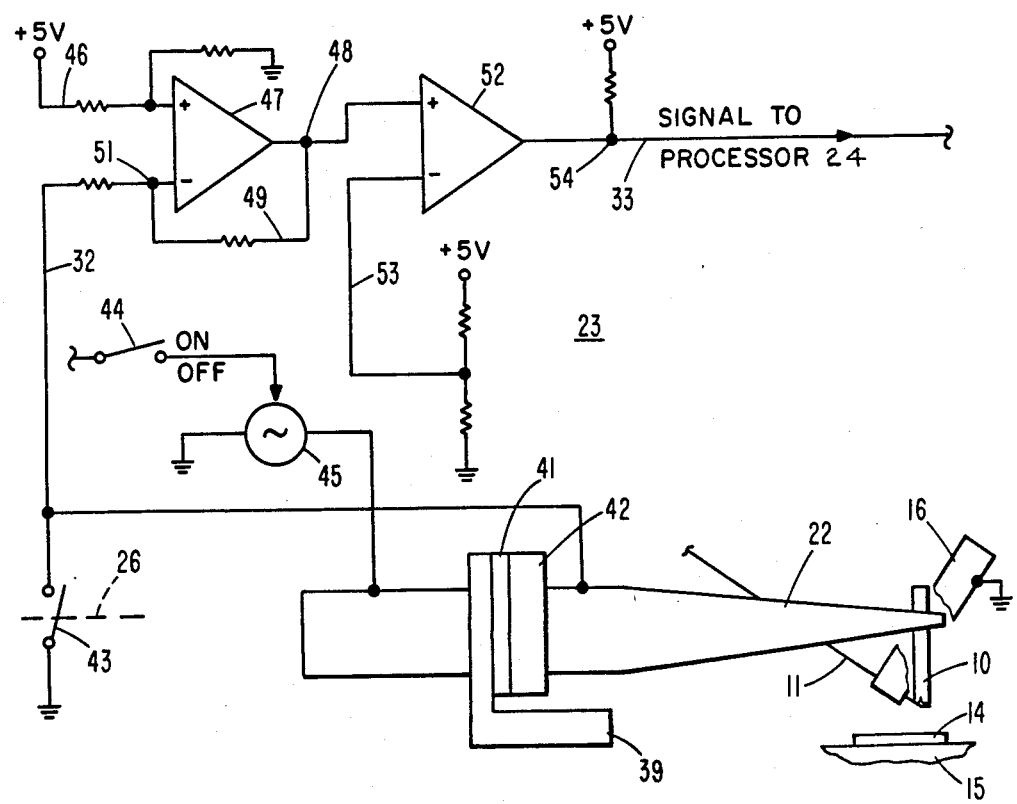
FIG. 7 is an electrical circuit and schematic diagram of the preferred embodiment sensing circuit.

Refer now to FIG. 7 showing a preferred embodiment sensing circuit. The bonding wedge 10 is shown supported by and mounted in transducer 22. Transducer 22 is supported on the wire bonder frame by the transducer holder 39 which is connected to the node flange 42 of transducer 22 by a rigid dielectric insulator 41. When the wedge 10 presses the fine wire 11 against the pad or terminal 14 on substrate or carrier 15 to produce the second bond, the processor control 24 closes switch 43 with the off/on signal on line 26. While the wedge 10 in applying force to the bonding wire 11 at the second bond, switch 44 is closed applying power to the ultrasonic generator 45 which supplies the necessary energy for completing the second bond. When the bonding operation is completed at second bond, switches 43 and 44 are opened, causing the voltage which appears on line 32 to be applied directly to the transducer 22 and also connected to the working face of the wedge 10. Since the terminal or pad 14 is electrically isolated from ground, the electrical path from the working face of the bonding tool 10 is through the wire 11 and wire clamp 16 to ground as explained hereinbefore. If no wire is under the working face of the bonding tool 10, there can be no electrical path to ground. If there is a wire under the bonding tool 10 at the time of sensing, the line 32 is connected to ground. A reference voltage of approximately 5 volts is applied via input line 46 to differential amplifier 47, creating an output of approximately 7.2 volts at node 48. The feedback voltage on line 49 creates an input voltage of approximately 3.6 volts at node 51 at the negative input of the differential amplifier 47. The 7.2 volt output at node 48 is applied to the positive input of comparator 52. The negative input to comparator 52 is applied to a reference voltage divider circuit to produce a reference voltage of approximately 4.5 volts on line 53. With the wire 11 under the wedge 10, the output voltage at output node 54 is 5 volts, and this voltage signal is applied to processor 24 via line 33 and is indicative of the bonding wire 11 being present during the second bond operation.

If there is no wire 11 under the bonding wedge 10 during the sensing operation, there is no electrical continuity through the wire 11 to the ground on the wire clamp which causes the output of differential amplifier 47 at node 48 to drop to 3.6 volts and the output at node 54 of comparator 52 to drop to approximately one-half volt and this signal is also applied to the control processor 24 via line 33 and is indicative of the absence of a wire under bonding wedge 10. As explained hereinbefore, when the sensing means 23 shown in FIG. 6 detects that there is no wire under the bonding wedge 10, processor control means 24 generates an interrupt signal on line 38 to cease operation of the wire bonder.

Figure 8:
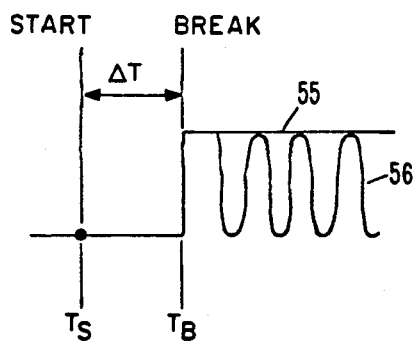
FIG. 8 is a waveform diagram of the output of the sensing circuit of FIG. 7 when a fine wire is being elongated and broken at the bonding wedge.

Refer now to FIG. 8 showing a waveform generated on output line 32 during sensing of the fine wire 11 breaking between the wire clamp 16 and the bonding wedge 10. At start time $T_S$ the wire clamps 16 are set in motion by the stepper motor 27 causing the wire 11 between the wire clamp 16 and the working face of the bonding tool 21 to start to elongate. During the time shown as Delta T, ($\Delta T$), the wire 11 continues to elongate but to provide a continuous electrical path to ground through the wire clamps 16. At time $T_B$, the bonding wire 11 breaks at the heel of the bonding wedge 10, causing the node 54 to swing from five volts to approximately one-half volt. The signal on line 33 to the processor control 24 is indicative of the wire breaking and the counter in processor control means 24 is effectively stopped. The time Delta T is indicative of the movement of wire clamps 16 during the elongation period of the tear motion. It will be understood that the wire clamps 16 can continue in the leftward direction after breaking the wire 11 even though the counter (not shown) has been effectively turned off. As is well known in the bonding art, the wire clamps do not move so far as to completely remove the bonding wire 11 from the wire guide 17. It will now be understood that the waveform which appears on output line 33 from the sensing means 23 is capable of indicating that the bonding wire 11 is either present or absent under the bonding wedge 10 and that the change in voltage levels, being timed from a starting point $T_S$ is indicative of the longation of the fine wire 11 which permits the control means 24 to calculate a uniform length tail to be restored under the working face 21 of the bonding wedge 10 during the subsequent movement of the wire clamps to the right. The random square wave 56 shown under the waveform 55 is indicative of the wire 11 touching in the wire guide 17 of the bonding wedge 10 after the breaking or tearing operation. This signal is observed but does not interfer with the detection of the wave form 55 or the time of breakin $T_B$ as shown in FIG. 8.

Having explained a preferred embodiment sensing and monitoring circuit as shown in FIGS. 6 to 8, it will now be understood that the preferred embodiment of this invention also maybe operated at first bond so that the first missing bond may be detected and that the wire bonder may be shut off so that the maximum damage that can occur is at one electrode or pad of a semiconductor device.

What we claim is:

1. Apparatus for providing a uniform length tail to a wedge bonding tool of an automtic wedge bonder of the type having moving wire clamps, comprising:
   wire clamps mounted on said wedge bonder,
   means for sensing the presence of a bonding wire under the bonding wedge of said wedge bonder at the last bond before breaking the bonding wire with said wire clamps,
   means for moving said wire clamps in a direction to elongate and break said bonding wire at said bonding wedge,
   timing means for measuring the differential elongation imparted to said bonding wire before said bonding wire breaks,
   control means coupled to said timing means for determining a uniform tail length which includes said elongation imparted to said bonding wire, and
   said control means being coupled to said means for moving said wire clamps and for providing a control signal for differentially moving said wire clamps in a direction to provide a uniform length tail under said bonding wedge.

2. Apparatus as set forth in claim 1 wherein said means for sensing the presence of a bonding wire under the bonding wedge comprises a circuit having a low voltage power source coupled to a bonding transducer which supports said bonding wedge.

3. Apparatus as set forth in claim 2 which further includes means for electrically isolating said bonding transducer from the wire bonder.

4. Apparatus as set forth in claim 2 which further includes amplifier means coupled to said bonding transducer for providing an output voltage indicative of the presence or absence of said bonding wire under said bonding wedge.

5. Apparatus as set forth in claim 4 which further includes a reference voltage connected to said wire clamps whereby said output voltage further indicates the condition of said bonding wire between said wire clamps and said bonding wedge.

6. Apparatus as set forth in claim 4 wherein said control means includes a processor adapted to monitor said output voltage during elongation and breakage of said bonding wire and for calculating a pulse train indicative of the distance required to move said wire clamps to provide a uniform length tail.

7. Apparatus as set forth in claim 6 wherein said means for moving said wire clamps comprise a stepper motor.

8. Apparatus as set forth in claim 1 which further includes a wire spool drive motor coupled to a wire spool for supplying said bonding wire to said wedge bonding tool, and
   wherein said control means are coupled to said wire spool drive motor for monitoring movement of said drive motor.

9. Apparatus as set forth in claim 8 wherein said control means is further coupled to said wire bonder for indicating an error condition when said wire spool drive motor does not feed bonding wire over a plurality of bonds.

10. The method of making uniform tail lengths under a bonding tool after a last bond comprising the steps of:
    bonding a fine bonding wire to a semiconductor device target with a bonding tool,
    clamping said bonding wire with wire clamps,
    moving said wire clamps in a direction to break said fine bonding wire at said bonding tool,
    measuring the differentially displacement of said wire clamps during the differentially elongation of said fine bonding wire between said bonding tool and said wire clamps until said bonding wire breaks at said bonding tool, and
    differentially moving said wire clamp in a direction to supply a predetermined tail length of wire under the working face of said bonding tool without the elongation of said fine bonding wire to provide a uniform tail length under said bonding tool.

11. The method as set forth in claim 10 which further includes the steps of:
    moving said wire clamps with a stepper motor, and
    monitoring the time required to elongate said fine bonding wire to cause it to break.

12. The method as set forth in claim 11 which further includes the steps of:
    calculating the elongation of said fine bonding wire, and
    calculating the number of electrical steps required to provide a uniform tail length unaffected by said elongation.

13. The method as set forth in claim 12 which further includes the step of:
    monitoring the movement of the wire spool feed motor to determine if bonding wire is being consumed during bonding operations.

14. Apparatus for supplying a uniform length tail bonding wire to a bonding tool of an automatic wedge bonder of the type having articulating wire clamps comprising:
    a transducer mounted on said wedge bonder,
    a bonding wedge mounted in said transducer opposite a semiconductor device to be bonded,
    wire clamp means mounted on said wedge bonder for clamping a bonding wire fed to said bonding wedge,
    means for moving said wire clamp means for elongation and breaking said bonding wire at a last bond and for feeding a predetermined length tail minus the amount of elongation under the working face of said wedge bonding tool,
    timing means coupled to said means for moving said wire clamp for measuring the differential elongation imparted to said bonding wire before said bonding wire breaks,
    circuit sensing means coupled to said transducer and to said wire clamp means for sensing the absence or presence of said bonding wire under said bonding wedge,
    wire feed drive motor means for supplying a slack loop of bonding wire to said bonding wedge, and
    control means coupled to said circuit sensing means, said timing means and said wire feed drive motor means for detecting the absence of a bonding wire at said bonding wedge and the amount of elongation of said fine wire and movement of said wire feed drive motor means.

15. Apparatus as set forth in claim 14 wherein said control means is coupled to said wire bonder and adapted to cease automatic wire bonding operations when no wire is sensed under said bonding wedge during a bonding operation.

16. Apparatus as set forth in claim 14 wherein said control means is coupled to said wire bonder and adapted to cease automatic wire bonding operations when no wire is being fed to said bonding wedge over a plurality of wire bonding operations.

* * * * *